(12) United States Patent
Hu

(10) Patent No.: US 12,557,184 B2
(45) Date of Patent: Feb. 17, 2026

(54) MODULAR HAND WARMER

(71) Applicant: Shenzhen Street Cat Technology Co., Ltd, Shenzhen (CN)

(72) Inventor: Zeda Hu, Shenzhen (CN)

(73) Assignee: Shenzhen Street Cat Technology Co., Ltd, Shenzhen (CN)

( * ) Notice: Subject to any disclaimer, the term of this patent is extended or adjusted under 35 U.S.C. 154(b) by 758 days.

(21) Appl. No.: 17/901,861

(22) Filed: Sep. 2, 2022

(65) Prior Publication Data

US 2023/0422353 A1 Dec. 28, 2023

(30) Foreign Application Priority Data

Jun. 22, 2022 (CN) .......................... 202221374828.X
Jun. 22, 2022 (CN) .......................... 202221579550.X

(51) Int. Cl.
*H05B 3/22* (2006.01)
*H02J 7/00* (2006.01)
*H05K 5/02* (2006.01)

(52) U.S. Cl.
CPC .............. *H05B 3/22* (2013.01); *H02J 7/0042* (2013.01); *H05K 5/0217* (2013.01); *H05K 5/0247* (2013.01)

(58) Field of Classification Search
CPC ........... H05B 3/22; H05B 3/06; H02J 7/0042; H05K 5/0217; H05K 5/0247; H05K 5/0086
See application file for complete search history.

(56) References Cited

U.S. PATENT DOCUMENTS

2016/0134144 A1* 5/2016 Miller ..................... H02J 7/342
320/107
2022/0014031 A1* 1/2022 Thomas ................ G06F 11/325

* cited by examiner

*Primary Examiner* — Robert G Bachner
(74) *Attorney, Agent, or Firm* — Bayramoglu Law Offices LLC

(57) ABSTRACT

A modular hand warmer includes a heating casing and a power supply component. The heating casing is hollow and provided therein with a power supply cavity. The heating casing is provided with a first outlet communicating with the power supply cavity. The heating casing is provided with a heating element. The shape of the power supply component is adapted to the power supply cavity. The power supply component is capable of being detachably inserted into the power supply cavity from the first outlet. The power supply component is capable of being electrically connected to the heating element. The first outlet is provided at the heating casing to facilitate the installation of the power supply component into the power supply cavity from the first outlet and the removal of the power supply component from the first outlet, which is conducive to the replacement and use of the power supply component.

18 Claims, 5 Drawing Sheets

MODULAR HAND WARMER

CROSS REFERENCE TO THE RELATED APPLICATIONS

This application is based upon and claims priority to Chinese Patent Applications No. 202221374828.X, filed on Jun. 2, 2022, and No. 202221579550.X, filed on Jun. 22, 2022, the entire contents of which are incorporated herein by reference.

TECHNICAL FIELD

The present disclosure relates to the field of heating equipment and, in particular, to a modular hand warmer.

BACKGROUND

At present, the hand warmer in the prior art usually converts electric energy into heat energy by supplying power to the heating element to provide heat and comfort. The hand warmers on the market mostly integrate the portable power supply and the heating element to achieve portability. This always results in a poor heating effect of the heating element when the power in the portable power supply is insufficient. Since the portable power supply and the heating element are integrated, the portable power supply cannot be easily replaced. When the portable power supply is charging, the use of the hand warmer is limited to locations near the charging cable. Thus, the hand warmer cannot be continuously used outdoors for a long time, which reduces the experience effect.

SUMMARY

(I) Technical Problems to be Solved

The present disclosure provides a modular hand warmer, which aims to solve the technical problem that the hand warmer cannot be continuously used outdoors for a long time in the prior art.

(II) Technical Solutions

To solve the above problems, the present disclosure provides a modular hand warmer, including a heating casing and a power supply component.

The heating casing is hollow and is provided therein with a power supply cavity. The heating casing is provided with a first outlet communicating with the power supply cavity and the heating casing is provided with a heating element.

The shape of the power supply component is adapted to the power supply cavity. The power supply component is capable of being detachably inserted into the power supply cavity from the first outlet and the power supply component is capable of being electrically connected to the heating element.

Preferably, a surface of the heating casing may be provided with a clamping slot. The power supply component may be provided with a groove. The groove may be located between the head and the tail of the power supply component. The head and the tail of the power supply component may be at opposite ends of the power supply component.

The first end of the buckle may be provided with a clamping portion. An elastic element may be arranged between the second end of the buckle and the bottom of the clamping slot. The first end and the second end of the buckle may be opposite ends of the buckle. The buckle may be provided with a hinged portion. The hinged portion may be rotatably arranged in the clamping slot. The hinged portion may be located between the first end and the second end of the buckle.

One end of the clamping slot may be provided with a notch, and the clamping portion is capable of being clamped in the groove through the notch.

Preferably, a surface of the head of the power supply component may be an arc surface.

Preferably, the clamping portion may include a fixed rod and an elastic rod that are arranged in parallel at the first end of the buckle.

One end of the fixed rod and one end of the elastic rod may be clamped in the groove. A gap may be formed between the fixed rod and the elastic rod. The end of the elastic rod clamped in the groove is capable of being elastically deformed. The distance between the fixed rod and the power supply component may be less than the distance between the elastic rod and the power supply component. An included angle between the side surface of the side facing the tail of the power supply component on the part of the elastic rod extending into the power supply cavity and the surface of the power supply component may be an acute angle.

Preferably, a limiting plate may be arranged in the clamping slot. The limiting plate may be located between the hinged portion and the clamping portion. The limiting plate is capable of abutting against the buckle.

Preferably, the second end of the buckle may be provided with a guide post, and the elastic element may be sleeved on the guide post.

Preferably, the power supply component may be a portable power supply.

Preferably, a second outlet communicating with the power supply cavity may be provided at the end of the heating casing opposite to the first outlet, and the head of the power supply component may be provided with a charging interface and a USB output interface.

The charging interface and the USB output interface may be located within a projection range of the second outlet on the power supply component.

Preferably, a conductive post may be arranged in the power supply cavity. One end of the conductive post may be located inside one end of the heating casing, and the other end of the conductive post may point to the first outlet. The conductive post may be electrically connected to the heating element.

A conductive hole may be provided at the head of the power supply component. A central axis of the conductive hole may not coincide with a central line of the power supply component. The head of the power supply component is capable of moving to the second outlet after passing through the first outlet. The conductive post may be arranged in the conductive hole. The power supply component is capable of supplying power to the heating element through the conductive post.

Preferably, the distance from the head to the tail of the power supply component may be greater than the distance from the first outlet to the second outlet.

(III) Beneficial Effects

In the present disclosure, the power supply component is installed in the power supply cavity, that is, the heating casing is sleeved on the power supply component. The first outlet is provided at the heating casing to facilitate the installation of the power supply component into the power supply cavity from the first outlet and the removal of the power supply component from the first outlet, which is conducive to the replacement and use of the power supply component. When the power supply component with insufficient power is charged separately, a new power supply component can be loaded into the power supply cavity, which does not affect the use of the modular hand warmer, thereby extending the continuous use time of the modular hand warmer outdoors.

REFERENCE NUMERALS

Figure 1:
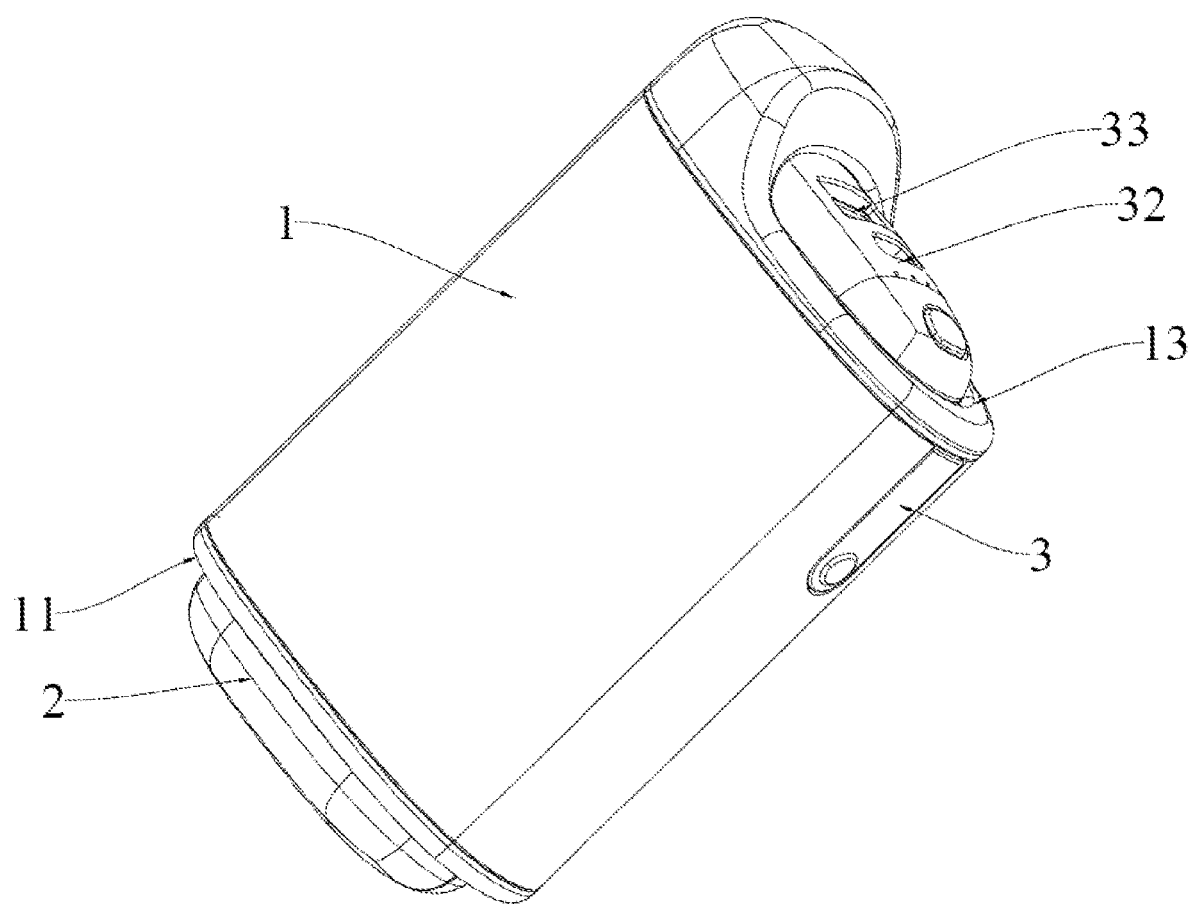
FIG. 1 is an overall structural diagram of a modular hand warmer of the present disclosure.
Figure 2:
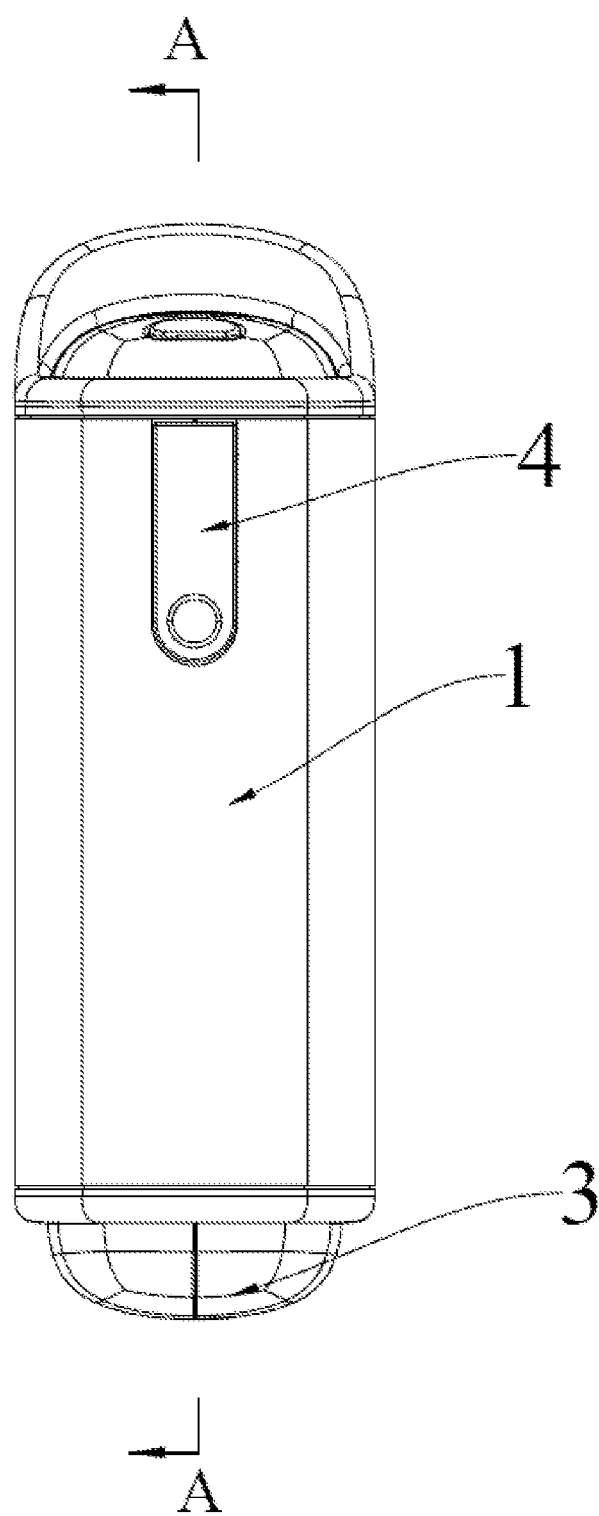
FIG. 2 is a side view of the modular hand warmer of the present disclosure.
Figure 3:
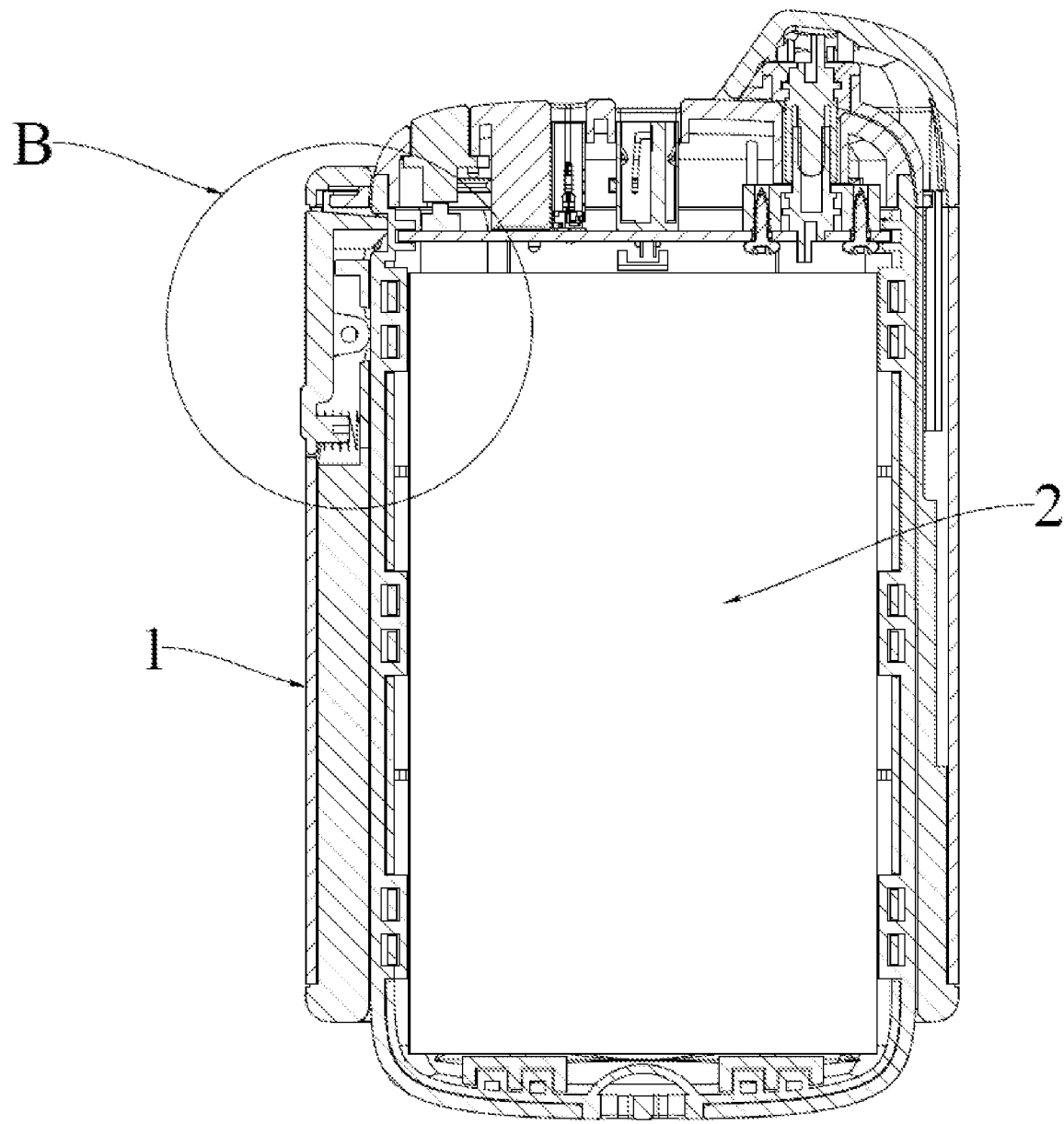
FIG. 3 is a cross-sectional view of FIG. 2 at A-A.

1: heating casing; 10: power supply cavity; 11: first outlet; 12: clamping slot; 121: limiting plate; 13: second outlet; and 14: conductive post;
2: power supply component; 21: groove; 22: charging interface; 23: USB output interface; and 24: conductive hole; and
3: buckle; 31: hinged portion; 32: clamping portion; 321: fixed rod; 322: elastic rod; 33: elastic element; and 34: guide post.

DETAILED DESCRIPTION OF THE EMBODIMENTS

In order to better explain the present disclosure and facilitate understanding, the present disclosure will be described in detail below through specific embodiments in combination with the accompanying drawings.

It should be noted that all directional indications (such as up, down, left, right, front, and rear . . . ) in the embodiments of the present disclosure are only used to explain the relative positional relationship between various components and movement based on the relative positional relationship (as shown in the accompanying drawings). If the specific relative positional relationship changes, the directional indication changes accordingly.

In addition, descriptions such as "first" and "second" in the present disclosure are only for the purpose of description and should not be interpreted as indicating or implying their relative importance or implicitly indicating the number of indicated technical features. Thus, features defined with "first" and "second" may explicitly or implicitly include at least one of the features. In the description of the present disclosure, "plurality" means at least two, such as two and three, unless otherwise expressly and specifically defined.

In the present disclosure, unless otherwise expressly specified and limited, the terms "connection" and "fixing" should be understood in a broad sense. For example, "fixing" can be a fixed connection, a detachable connection, or an integrated connection; it can be a mechanical connection or an electrical connection; it can be a direct connection or an indirect connection through an intermediate medium, and it can be a communication within two elements or an interaction relationship between two elements, unless otherwise expressly defined. For those of ordinary skill in the art, the specific meanings of the above terms in the present disclosure can be understood according to specific situations.

The present disclosure provides a modular hand warmer. As shown in FIG. 1 to FIG. 6, the modular hand warmer includes a heating casing 1 and a power supply component 2. The heating casing 1 is hollow and is provided therein with a power supply cavity 10. The heating casing 1 is provided with a first outlet 11 communicating with the power supply cavity 10. The heating casing 1 is provided with a heating element. The shape of the power supply component 2 is adapted to the power supply cavity 10. The power supply component 2 is capable of being detachably inserted into the power supply cavity 10 from the first outlet 11. The power supply component 2 is electrically connected to the heating element. The heating casing 1 is provided with the first outlet 11 communicating with the power supply cavity 10. The head of the power supply component 2 is capable of extending into or out of the power supply cavity 10 through the first outlet 11. In the present disclosure, when the power supply component 2 is installed in the power supply cavity 10, the power supply component 2 can be electrically connected to the heating element through contact. At this time, the heating element converts electric energy into heat energy to realize the heating function. When the power in the power supply component 2 is insufficient, the power supply component 2 is removed from the first outlet 11, and a new power supply component 2 is loaded into the power supply cavity 10 from the first outlet 11, such that the hand warmer can be continuously used outdoors for a long time. In the present disclosure, the first outlet 11 is provided at the heating casing 1, the power supply component 2 is installed in the power supply cavity 10, that is, the heating casing 1 is sleeved on the power supply component 2 to facilitate installation of the power supply component 2 into the power supply cavity 10 from the first outlet 11 and the removal of the power supply component 2 from the first outlet 11, which is conducive to replacement and use of the power supply component 2. The power supply component 2 with insufficient power is charged separately, which does not affect the use of the modular hand warmer, thereby extending the continuous use time of the modular hand warmer outdoors. In addition, in the present disclosure, the first outlet 11 is provided at the heating casing 1 to facilitate the installation and disassembly of the power supply component 2, which facilitates maintenance and replacement when the power supply component 2 or the heating element in the heating casing 1 malfunctions, thereby reducing the cost. In a preferred embodiment, the detachable connection between the power supply component 2 and the heating casing 1 can be achieved by threaded connection and clamping. In a preferred embodiment, power supply component 2 is a portable power supply, and the portable power supply may specifically include dry batteries or accumulators, such as lithium batteries or nickel-chromium batteries. When the power supply component 2 is separated from the heating casing 1, the power supply component 2 can supply power to the outside through a USB interface to realize the function of a power bank.

Figure 4:
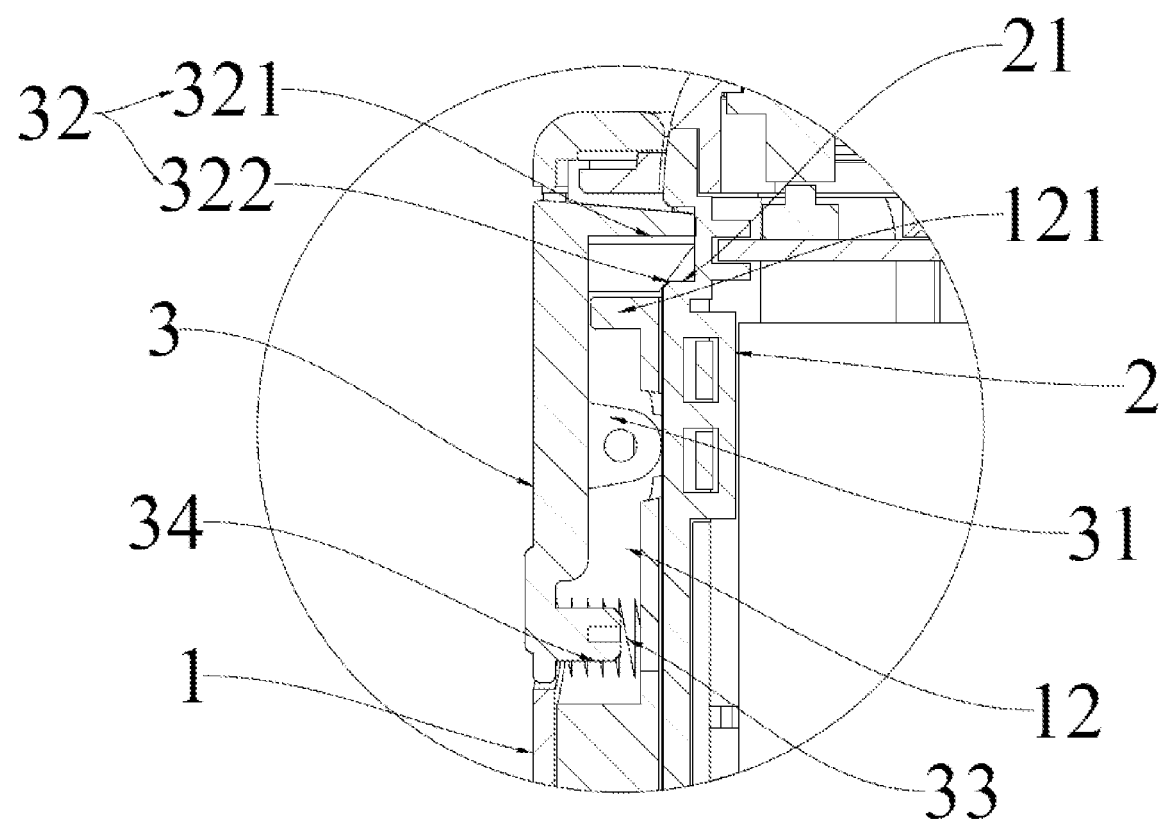
FIG. 4 is an enlarged view of FIG. 3 at B.

Further, as shown in FIG. 4, the modular hand warmer further includes a buckle 3. The surface of heating casing 1 is provided with a clamping slot 12. The power supply component 2 is provided with a groove 21. Groove 21 is located between the head and the tail of the power supply component 2. The head and the tail of the power supply component 2 are at opposite ends of the power supply component 2. The buckle 3 is provided with a hinged portion 31. The hinged portion 31 is rotatably arranged in the clamping slot 12. The first end of buckle 3 is provided with a clamping portion 32. An elastic element 33 is arranged between the second end of the buckle 3 and the bottom of the clamping slot 12. The hinged portion 31 is located between the first end and the second end of buckle 3. The first end and the second end of buckle 3 are opposite ends of buckle 3. One end of the clamping slot 12 is provided with a notch, and the clamping portion 32 is capable of being clamped in groove 21 through the notch.

In the present embodiment, the second end of buckle 3 is subjected to the elastic force of the elastic element 33, the clamping portion 32 at the first end of the buckle 3 rotates through the notch and enters the power supply cavity 10, and the clamping portion 32 on the buckle 3 is buckled in the groove 21 of the power supply component 2. At this time, the clamping portion 32 can be closely attached to groove 21 of the power supply component 2 under the action of the elastic element 33 to install the power supply component 2 in the power supply cavity 10. To remove the power supply component 2, only the second end of the buckle 3 needs to be pressed. At this time, the second end of buckle 3 will compress the elastic element 33, the clamping portion 32 on buckle 3 will withdraw from the power supply cavity 10, and the power supply component 2 can be removed at this time. The clamping portion 32 on buckle 3 is clamped in groove 21 to fix the power supply component 2, which facilitates the disassembly and assembly of the power supply component 2.

Figure 6:
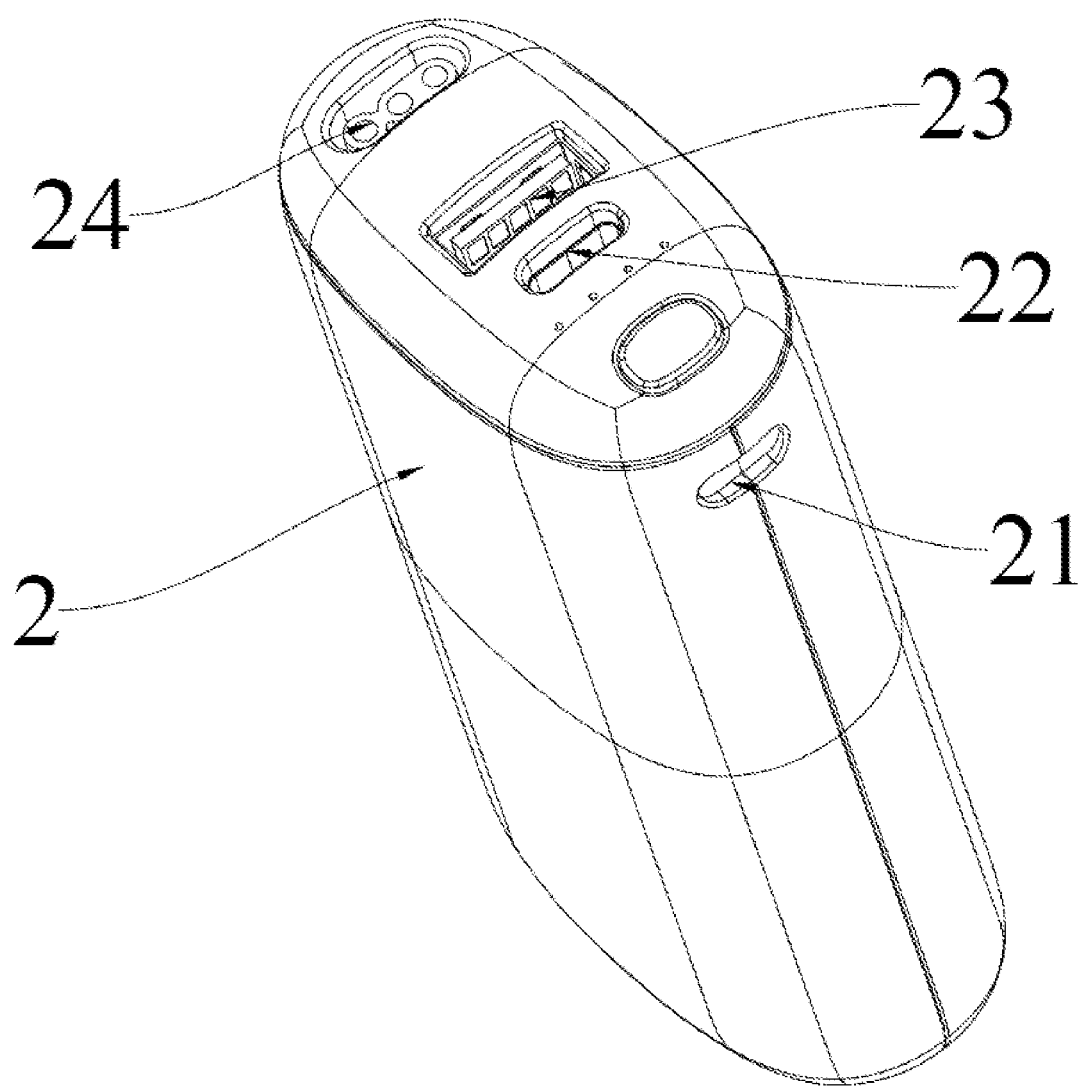
FIG. 6 is a schematic structural diagram of a power supply component of the present disclosure.

In a preferred embodiment, as shown in FIG. 1 and FIG. 6, a surface of the head of the power supply component 2 is an arc surface. The clamping portion 32 includes a fixed rod 321 and an elastic rod 322 that are arranged in parallel at the first end of the buckle 3.

One end of the fixed rod 321 and one end of the elastic rod 322 are clamped in the groove 21. A gap is formed between the fixed rod 321 and the elastic rod 322. The end of the elastic rod 322 clamped in groove 21 is capable of being elastically deformed. The distance between the fixed rod 321 and the power supply component 2 is less than the distance between the elastic rod 322 and the power supply component 2. An included angle between a side surface of a side facing the tail of the power supply component 2 on a part of the elastic rod 322 extending into the power supply cavity 10 and a surface of the power supply component 2 is an acute angle. In this way, when the head of the power supply component 2 passes through the first outlet 11 and enters the power supply cavity 10, during the movement of the power supply component 2 in the power supply cavity 10, the arc surface of the head of the power supply component 2 and the inclined surface on the elastic rod 322 can both play a guiding role. When the head of the power supply component 2 is in contact with the elastic rod 322, the fixed rod 321 and the elastic rod 322 can easily slide over the head of the power supply component 2 and be clamped in the groove 21. In addition, the elastic rod 322 is deformed toward the fixed rod 321 under the action of the power supply component 2 until the elastic rod 322 and the fixed rod 321 are completely clamped into the groove 21. At this time, groove 21 is occupied by the elastic rod 322 and the fixing rod 321, and the displacement of the power supply component 2 is restricted.

In addition, a limiting plate 121 is arranged in the clamping slot 12. The limiting plate 121 is located between the hinged portion 31 and the clamping portion 32. The limiting plate 121 is capable of abutting against buckle 3. By arranging the limiting plate 121, the rotation angle of the second end of the buckle 3 can be limited, and the part of the clamping portion 32 extending into the power supply cavity 10 can be precisely designed, such that the clamping portion 32 can be clamped in the groove 21 of the power supply component 2 more securely. The second end of buckle 3 is provided with a guide post 34, and the elastic element 33 is sleeved on the guide post 34. At this time, the elastic element 33 includes one end abutting against the bottom of the clamping slot 12 and the other end abutting against buckle 3. In a preferred embodiment, the elastic element 33 is a spring. In the present embodiment, when the clamping portion 32 is clamped into groove 21 of the power supply component 2, the spring is in a compressed state. At this time, the clamping portion 32 is still closely attached to the bottom of groove 21 under the action of the spring, such that the power supply component 2 will not slide from the power supply cavity 10 during the use of the modular hand warmer provided by the present disclosure.

Furthermore, as shown in FIG. 1 and FIG. 6, a second outlet 13 communicating with the power supply cavity 10 is provided at an end of the heating casing 1 opposite to the first outlet 11, and the head of the power supply component 2 is provided with a charging interface 22 and a universal serial bus (USB) output interface 23. In a specific embodiment, the charging interface 22 is a Type-C interface with a fast charging function, and the USB output interface on the power supply component 2 can supply power to external electrical appliances and thus function as a portable power supply. The charging interface 22 and the USB output interface 23 are located within a projection range of the second outlet 13 on the power supply component 2, such that the power supply component 2 can also supply power to external electrical appliances when it is inside the heating casing 1. It should be noted that the size of the second outlet 13 is less than the head of the power supply component 2, and the power supply component 2 cannot pass through the second outlet 13. According to the modular hand warmer provided by the utility model, the power supply component 2 can be removed and charged separately, and the charging cable can be inserted into the charging interface 22 through the second outlet 13 to charge the power supply component 2. At this time, there is no need to remove the power supply component 2, which provides users with different charging methods. The distance from the head to the tail of the power supply component 2 is greater than the distance from the first outlet 11 to the second outlet 13, that is, after the power supply component 2 is installed in the power supply cavity 10, a part of the power supply component 2 is located outside the power supply cavity 10, which facilitates the disassembly of the power supply component 2.

Figure 5:
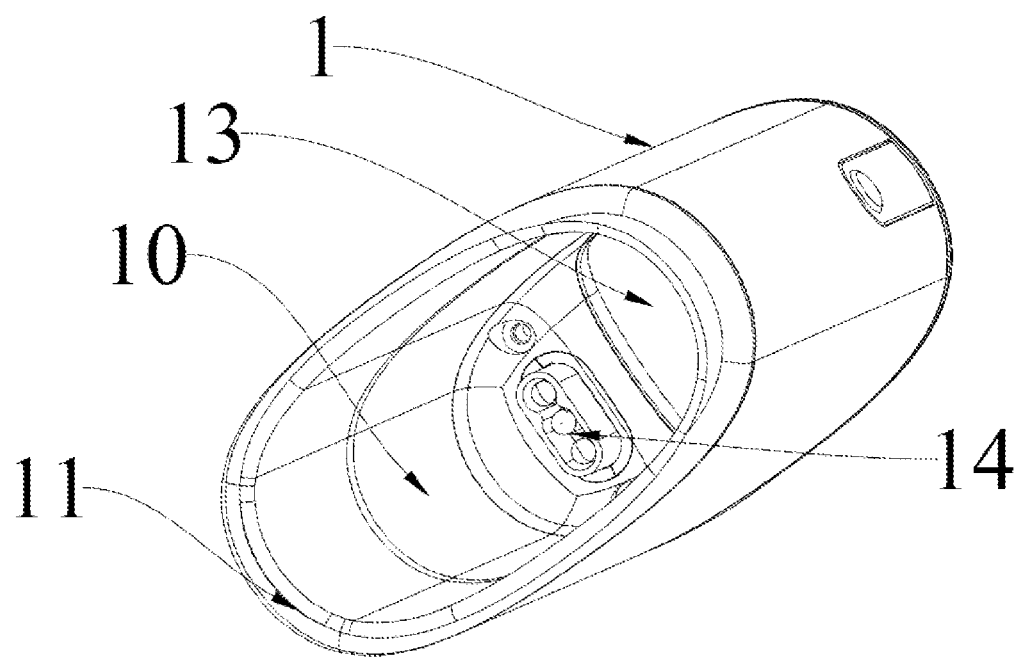
FIG. 5 is a structural diagram of a heating casing of the present disclosure.

Finally, as shown in FIG. 5 and FIG. 6, the conductive post 14 is arranged in the power supply cavity 10. One end of the conductive post 14 located on one side where the second outlet 13 is located, and the other end of the conductive post 14 points to the first outlet 11. The conductive post 14 is electrically connected to the heating element. A conductive hole 24 is provided at the head of the power supply component 2. A central axis of the conductive hole 24 does not coincide with a central line of the power supply component 2. The head of the power supply component 2 is capable of moving to the second outlet 13 through the first outlet 11. The conductive post 14 is arranged in the conductive hole 24. The power supply component 2 is capable of supplying power to the heating element through the conductive post 14. After the power supply component 2 is installed in the power supply cavity 10, the conductive post 14 can be inserted into the conductive hole 24 to transmit the electric energy of the power supply component 2 to the heating element. If the user does not align the conductive hole 24 on the power supply component 2 with the conductive post 14 when inserting the power supply component 2 into the power supply cavity 10, the power supply component 2 cannot be fixedly installed in the power supply cavity 10 to prevent the user from inserting the power supply component 2 inserted in reverse and play the role of foolproof design.

It should be understood that the above description of the specific embodiments of the present disclosure is only to illustrate the technical route and characteristics of the present disclosure, and its purpose is to enable those skilled in the art to understand the content of the present disclosure and implement it accordingly. However, the present disclosure is not limited to the above-mentioned specific embodiments. Any changes or modifications made within the scope of the claims of the present disclosure shall be covered within the protection scope of the present disclosure.

What is claimed is:

1. A modular hand warmer comprising:
    a heating casing, wherein the heating casing is hollow, a power supply cavity is provided in the heating casing, the heating casing is provided with a first outlet communicating with the power supply cavity, and the heating casing is further provided with a heating element;
    a power supply component, wherein a shape of the power supply component is adapted to the power supply cavity, the power supply component is configured to be detachably inserted into the power supply cavity from the first outlet, and the power supply component is configured to be electrically connected to the heating element; and
    a buckle, wherein
    a surface of the heating casing is provided with a clamping slot;
    the power supply component is provided with a groove, the groove is located between a head and a tail of the power supply component, and the head and the tail of the power supply component are at opposite ends of the power supply component;
    a first end of the buckle is provided with a clamping portion, and an elastic element is arranged between a second end of the buckle and a bottom of the clamping slot, wherein the first end and the second end of the buckle are opposite ends of the buckle;
    the buckle is provided with a hinged portion, the hinged portion is rotatably arranged in the clamping slot, and the hinged portion is located between the first end and the second end of the buckle; and
    one end of the clamping slot is provided with a notch, and the clamping portion is configured to be clamped in the groove through the notch.

2. The modular hand warmer according to claim 1, wherein a surface of the head of the power supply component is an arc surface.

3. The modular hand warmer according to claim 2, wherein the clamping portion comprises a fixed rod and an elastic rod, wherein the fixed rod and the elastic rod are arranged in parallel at the first end of the buckle;
    one end of the fixed rod and one end of the elastic rod are clamped in the groove, a gap is formed between the fixed rod and the elastic rod, the end of the elastic rod clamped in the groove is configured to be elastically deformed, and a distance between the fixed rod and the power supply component is less than a distance between the elastic rod and the power supply component; and
    an included angle between a side surface of a side on a part of the elastic rod and a surface of the power supply component is an acute angle, wherein the part of the elastic rod extends into the power supply cavity, and the side on the part of the elastic rod faces the tail of the power supply component.

4. The modular hand warmer according to claim 1, wherein the power supply component is a portable power supply.

5. The modular hand warmer according to claim 1, wherein a limiting plate is arranged in the clamping slot, the limiting plate is located between the hinged portion and the clamping portion, and the limiting plate is configured to abut against the buckle.

6. The modular hand warmer according to claim 1, wherein the second end of the buckle is provided with a guide post, and the elastic element is sleeved on the guide post.

7. The modular hand warmer according to claim 1, wherein a second outlet communicating with the power supply cavity is provided at an end of the heating casing, wherein the end of the heating casing is opposite to the first outlet, and the head of the power supply component is provided with a charging interface and a universal serial bus (USB) output interface; and
    the charging interface and the USB output interface are located within a projection range of the second outlet on the power supply component.

8. The modular hand warmer according to claim 7, wherein a conductive post is arranged in the power supply cavity, a first end of the conductive post is located inside one end of the heating casing, a second end of the conductive post points to the first outlet, and the conductive post is configured to be electrically connected to the heating element; and
    a conductive hole is provided at the head of the power supply component, a central axis of the conductive hole does not coincide with a central line of the power supply component, the head of the power supply component is configured to move to the second outlet through the first outlet, the conductive post is arranged in the conductive hole, and the power supply component is configured to supply power to the heating element through the conductive post.

9. The modular hand warmer according to claim 7, wherein a distance from the head to the tail of the power supply component is greater than a distance from the first outlet to the second outlet.

10. The modular hand warmer according to claim 1, wherein the power supply component is a portable power supply.

11. The modular hand warmer according to claim 2, wherein the power supply component is a portable power supply.

12. The modular hand warmer according to claim 3, wherein the power supply component is a portable power supply.

13. The modular hand warmer according to claim 2, wherein a limiting plate is arranged in the clamping slot, the limiting plate is located between the hinged portion and the clamping portion, and the limiting plate is configured to abut against the buckle.

14. The modular hand warmer according to claim 3, wherein a limiting plate is arranged in the clamping slot, the limiting plate is located between the hinged portion and the clamping portion, and the limiting plate is configured to abut against the buckle.

15. The modular hand warmer according to claim 2, wherein the second end of the buckle is provided with a guide post, and the elastic element is sleeved on the guide post.

16. The modular hand warmer according to claim 3, wherein the second end of the buckle is provided with a guide post, and the elastic element is sleeved on the guide post.

17. The modular hand warmer according to claim 2, wherein a second outlet communicating with the power supply cavity is provided at an end of the heating casing, wherein the end of the heating casing is opposite to the first outlet, and the head of the power supply component is provided with a charging interface and a universal serial bus (USB) output interface; and the charging interface and the USB output interface are located within a projection range of the second outlet on the power supply component.

18. The modular hand warmer according to claim 3, wherein a second outlet communicating with the power supply cavity is provided at an end of the heating casing, wherein the end of the heating casing is opposite to the first outlet, and the head of the power supply component is provided with a charging interface and a universal serial bus (USB) output interface; and the charging interface and the USB output interface are located within a projection range of the second outlet on the power supply component.

* * * * *